under 35

United States Patent
Tanaka

(10) Patent No.: US 11,152,246 B2
(45) Date of Patent: Oct. 19, 2021

(54) CHUCK TABLE AND INSPECTION APPARATUS

(71) Applicant: DISCO CORPORATION, Tokyo (JP)

(72) Inventor: Hideaki Tanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/773,358

(22) Filed: Jan. 27, 2020

(65) Prior Publication Data

US 2020/0266091 A1  Aug. 20, 2020

(30) Foreign Application Priority Data

Feb. 14, 2019  (JP) .............................. JP2019-024850

(51) Int. Cl.
| | | |
|---|---|---|
| *B23K 26/02* | (2014.01) | |
| *H01L 21/683* | (2006.01) | |
| *B28D 5/00* | (2006.01) | |
| *G01N 21/95* | (2006.01) | |
| *B23K 101/40* | (2006.01) | |

(52) U.S. Cl.
CPC .......... *H01L 21/6838* (2013.01); *B23K 26/02* (2013.01); *B28D 5/0094* (2013.01); *G01N 21/9501* (2013.01); *B23K 2101/40* (2018.08)

(58) Field of Classification Search
CPC .................................................. H01L 21/6838
See application file for complete search history.

(56) References Cited

U.S. PATENT DOCUMENTS

| | | | | |
|---|---|---|---|---|
| 2013/0082038 A1* | 4/2013 | Yoshikawa | .......... | B23K 26/048 219/121.81 |
| 2018/0019168 A1* | 1/2018 | Matsuzaki | .......... | H01L 21/6833 |
| 2018/0065187 A1* | 3/2018 | Yamamoto | ............ | H01L 21/682 |
| 2018/0099375 A1* | 4/2018 | Ando | ...................... | B24B 7/228 |

FOREIGN PATENT DOCUMENTS

| | | |
|---|---|---|
| JP | 2006281434 A | 10/2006 |
| JP | 2010087141 A | 4/2010 |
| JP | 2014013812 A | 1/2014 |

OTHER PUBLICATIONS

IPOS search report issued in counterpart Singapore patent application No. 10202000762W, dated Nov. 27, 2020.

\* cited by examiner

*Primary Examiner* — Md N Haque
(74) *Attorney, Agent, or Firm* — Greer Burns & Crain Ltd.

(57) ABSTRACT

A chuck table holding a frame unit including a workpiece is securely placed in an opening of an annular frame by a tape. A transparent holder having a holding surface holds the workpiece with the tape interposed therebetween. A frame body is erected around and surrounding the holder, the frame body having a plurality of suction holes that are open in an inner circumferential surface of the frame body. The frame body has an inside diameter equal to or smaller than an inside diameter of the annular frame. While an opening of the frame body is being covered by the tape, a suction force is transmitted through the suction holes into the frame body, discharging air from between the tape and the holding surface to bring the tape into intimate contact with the holding surface thereby securing the workpiece of the frame unit to the holding surface.

6 Claims, 10 Drawing Sheets

CHUCK TABLE AND INSPECTION APPARATUS

BACKGROUND OF THE INVENTION

Field of the Invention

The present invention relates to a chuck table and an inspection apparatus for observing a workpiece of a frame unit through a tape.

Description of the Related Art

Cutting blades and laser beams are used to process semiconductor device wafers and device wafers made of silicon carbide (SiC), lithium tantalate (LT), lithium niobate (LN), or the like. Workpieces such as wafers are available as a frame unit in which a workpiece is securely placed in an opening in an annular frame by a tape, so that device chips divided from the workpiece will not spread apart. The workpiece is fixed to a porous chuck table by a tape and then processed by a cutting blade or a laser beam (see, for example, JP 2014-013812A).

However, there are demands for observing a reverse side of a workpiece before and after the workpiece is processed. For example, in a case where a face side of a workpiece where devices are formed is fixed to a tape and the workpiece is cut from the reverse side thereof, streets or projected dicing lines on the face side of the workpiece may be observed with an infrared camera from the reverse side that is exposed. If the exposed reverse side is covered with a metal film, then the streets on the face side cannot be detected when attempts are made to observe them from the reverse side with the infrared camera. In view of this difficulty, there has been devised a chuck table made of a transparent material such as glass for observing the face side of a workpiece placed on the chuck table through the chuck table (see, for example, JP 2006-281434A and JP 2010-087141A).

SUMMARY OF THE INVENTION

In a case where a chuck table having a holder made of a transparent material such as glass is used, since glass is normally impermeable to air, vacuum grooves need to be formed in a holding surface of the holder for applying a vacuum to a workpiece on the chuck table to hold the workpiece under suction on the chuck table. However, the vacuum grooves tend to prevent the infrared camera from focusing clearly on the face side of the workpiece, making it difficult to observe the face side along the vacuum grooves. One solution would be to cover the holder in its entirety with a tape and develop a vacuum between the holding surface and the tape through suction holes defined around the holder. Though the suction holes eliminate the need for forming vacuum grooves in the holding surface, air may remain trapped between the holding surface and the tape, possibly presenting an obstacle to the observation of the face side from the reverse side of the workpiece.

It is therefore an object of the present invention to provide a chuck table and an inspection apparatus which make it easy to observe a workpiece placed on a holder made of a transparent material.

In accordance with an aspect of the present invention, there is provided a chuck table for holding a frame unit including a workpiece securely placed in an opening of an annular frame by a tape, including a holder having a holding surface for holding the workpiece thereon with the tape interposed therebetween, the holder being made of a transparent material, and a frame body erected around the holder and surrounding the holder, the frame body having a plurality of suction holes defined therein that are open in an inner circumferential surface of the frame body, in which the frame body has an inside diameter equal to or smaller than an inside diameter of the annular frame, and, while an opening of the frame body is being covered by the tape of the frame unit, a suction force is transmitted through the suction holes into the frame body, discharging air from between the tape and the holding surface to bring the tape into intimate contact with the holding surface thereby securing the workpiece of the frame unit to the holding surface.

Preferably, the holding surface of the holder is flat in its entirety and is free of suction grooves.

In accordance with another aspect of the present invention, there is provided an inspection apparatus for inspecting a workpiece, including a chuck table for holding, on a holding surface, a frame unit including a workpiece securely placed in an opening of an annular frame by a tape, a camera unit for capturing an image of the workpiece held on the chuck table through the holding surface from a holding surface side, and a moving unit for relatively moving the chuck table and the camera unit in X-axis directions parallel to the holding surface or Y-axis directions perpendicular to the X-axis directions. The chuck table includes a holder having the holding surface for holding the workpiece with the tape interposed therebetween, the holder being made of a transparent material, and a frame body erected around the holder and surrounding the holder, the frame body having a plurality of suction holes defined therein that are open in an inner circumferential surface of the frame body. The frame body has an inside diameter equal to or smaller than an inside diameter of the annular frame, and, while an opening of the frame body is being covered by the tape of the frame unit, a suction force is transmitted through the suction holes into the frame body, discharging air from between the tape and the holding surface to bring the tape into intimate contact with the holding surface thereby securing the workpiece of the frame unit to the holding surface.

Preferably, the inspection apparatus is incorporated in a processing apparatus including a processing unit for processing the workpiece with a cutting blade or a laser beam, and the processing unit processes the workpiece held on the chuck table and inspects the workpiece by capturing an image of the workpiece processed by the processing unit through the chuck table.

According to the present invention, even though the holder is made of a transparent material, the workpiece can easily be observed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

First Embodiment

Figure 1:
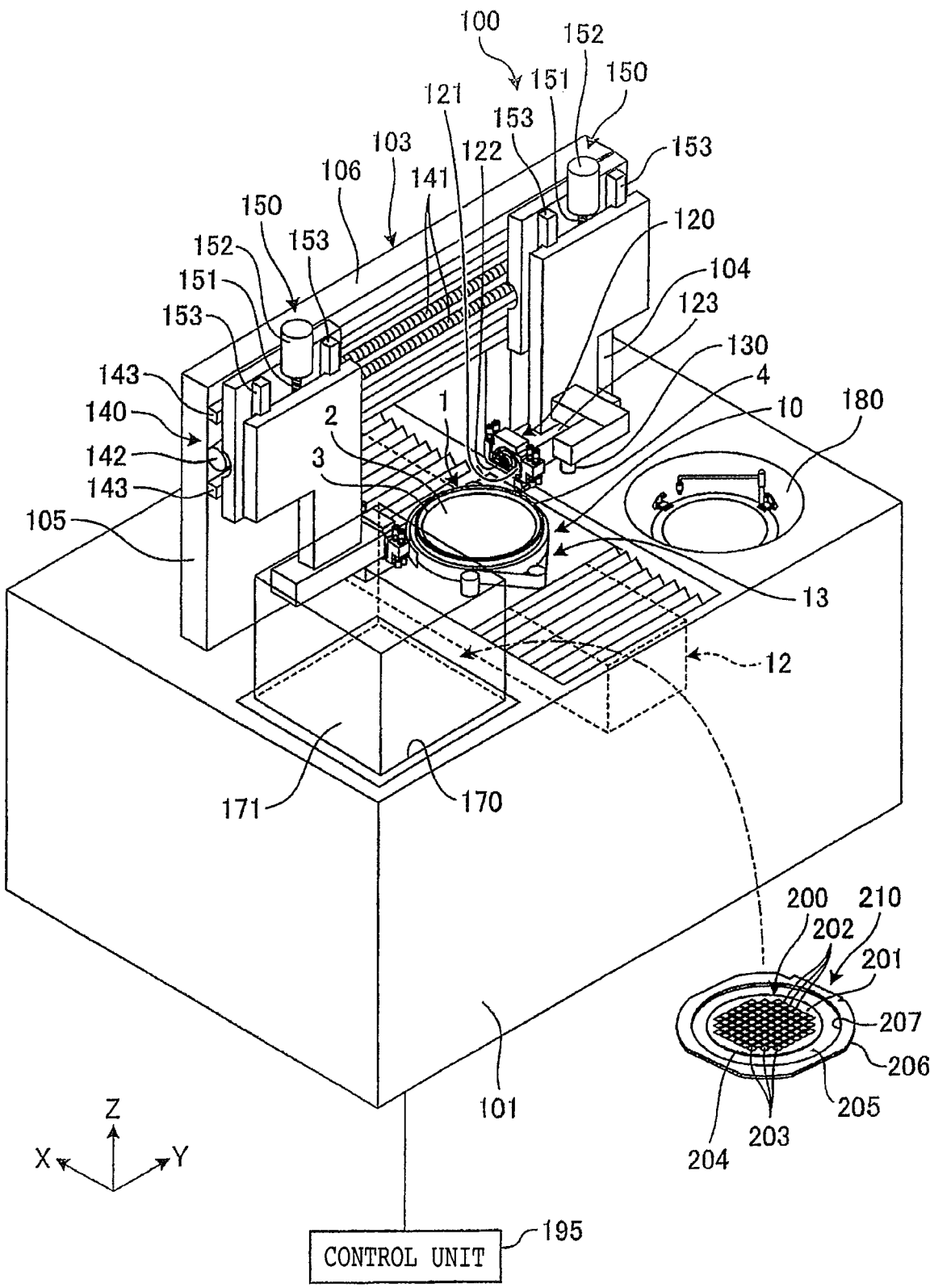
FIG. 1 is a perspective view illustrating by way of example a processing apparatus including a chuck table and an inspection apparatus according to a first embodiment of the present invention.
Figure 2:
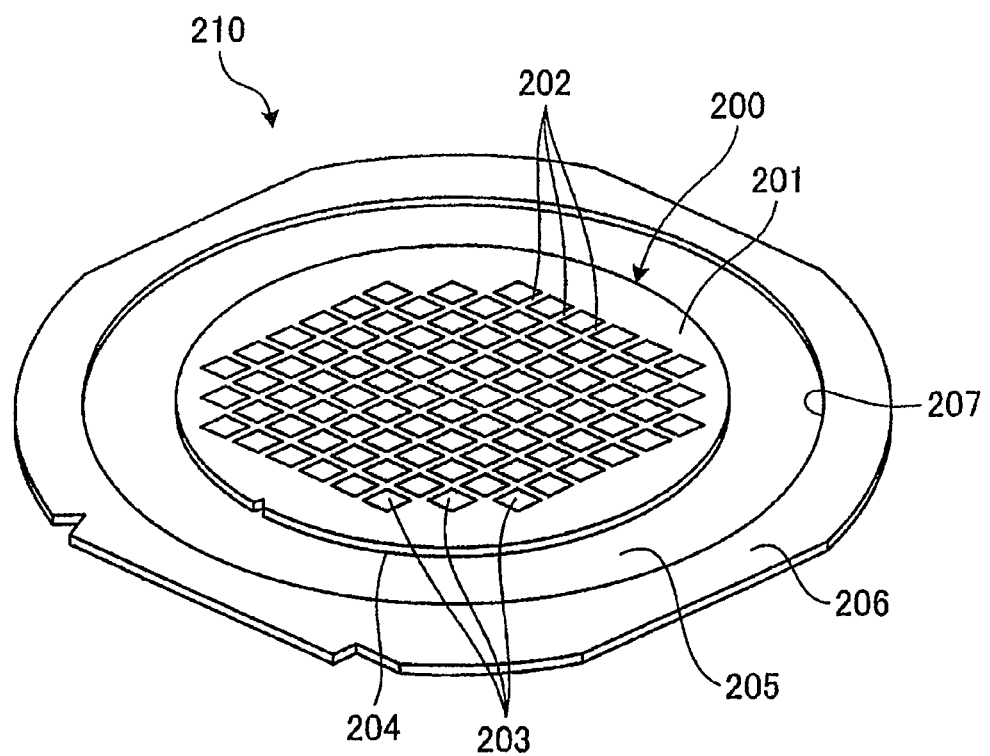
FIG. 2 is a perspective view of a frame unit including a workpiece to be processed by the processing apparatus illustrated in FIG. 1.
Figure 3:
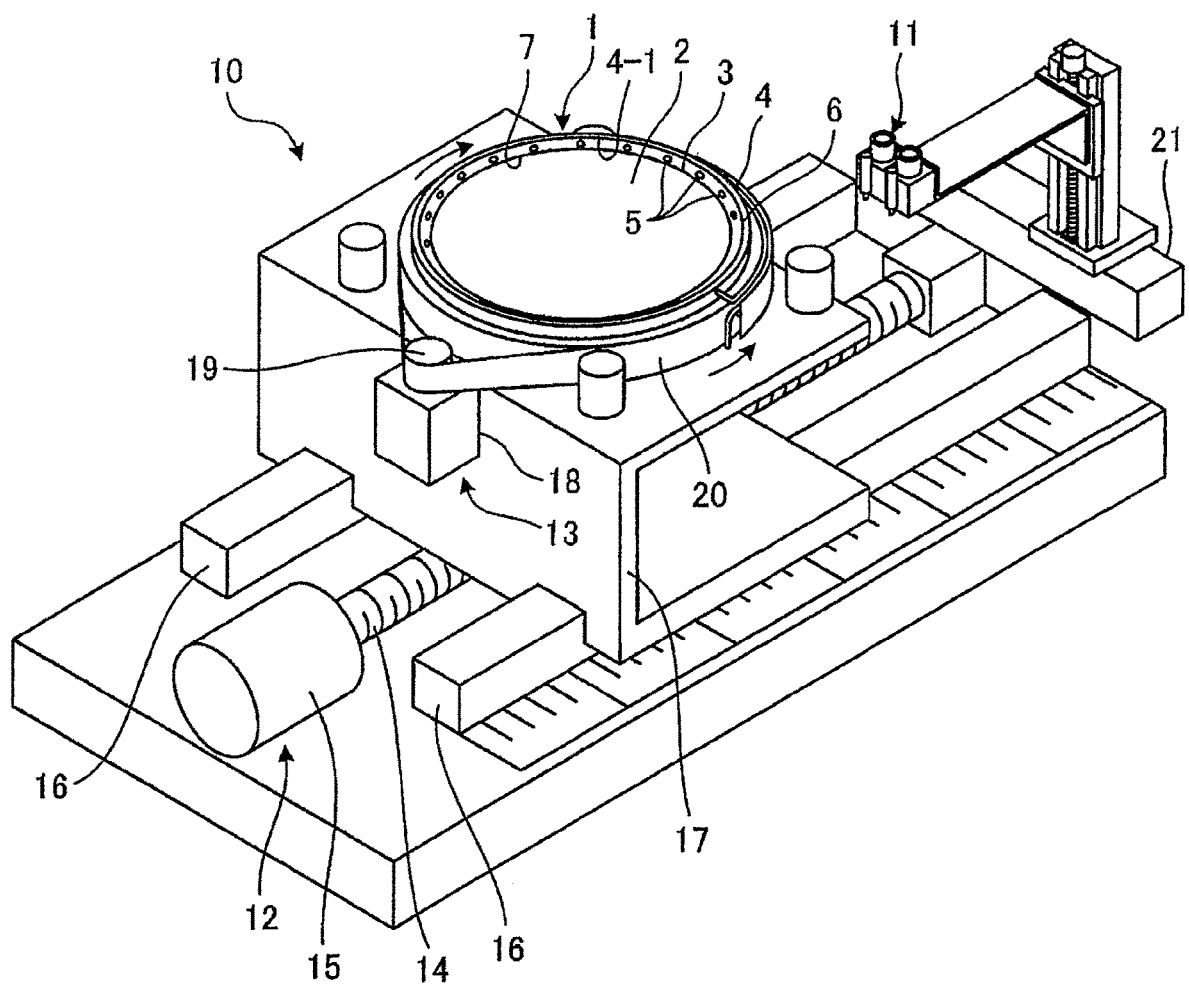
FIG. 3 is a perspective view illustrating by way of example the inspection apparatus according to the first embodiment.
Figure 4:
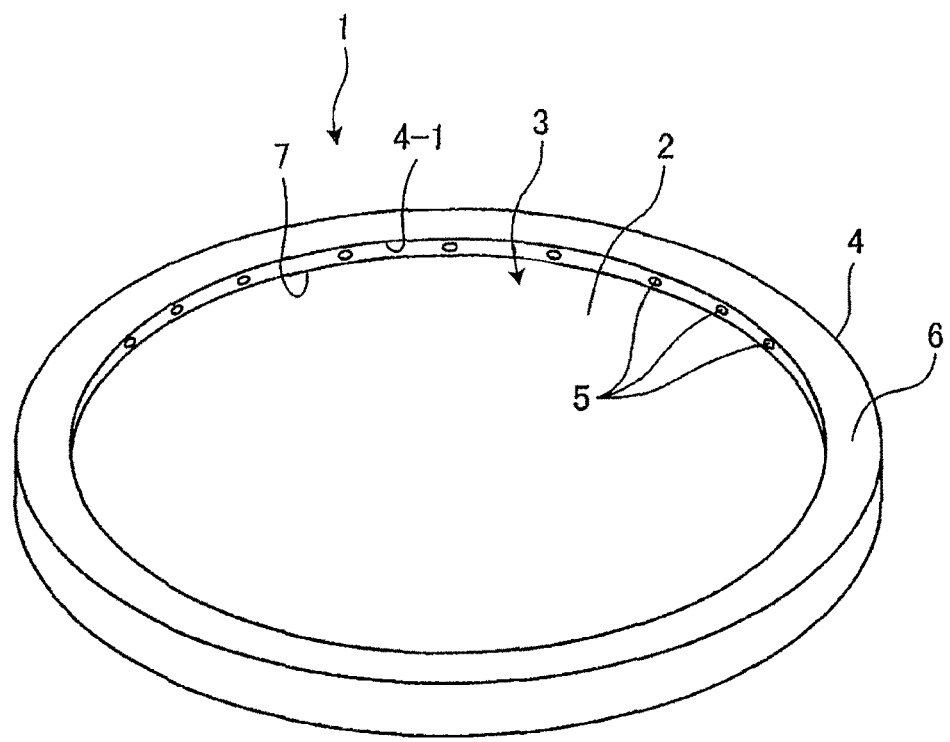
FIG. 4 is a perspective view illustrating by way of example a chuck table of the processing apparatus according to the first embodiment.
Figure 5:
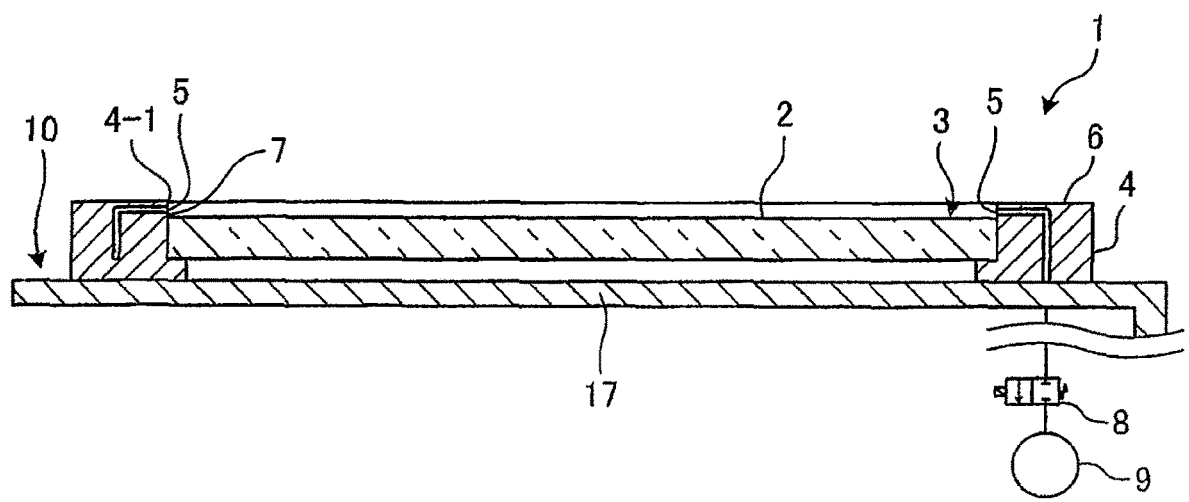
FIG. 5 is a cross-sectional view of the chuck table according to the first embodiment.

A chuck table and an inspection apparatus according to a first embodiment of the present invention will be described below with reference to the drawings. FIG. 1 illustrates in perspective a processing apparatus including the chuck table and the inspection apparatus according to the first embodiment. FIG. 2 illustrates in perspective a frame unit including a workpiece to be processed by the processing apparatus illustrated in FIG. 1. FIG. 3 illustrates in perspective the inspection apparatus according to the first embodiment. FIG. 4 illustrates in perspective a chuck table of the processing apparatus according to the first embodiment. FIG. 5 illustrates in cross section the chuck table according to the first embodiment.

As illustrated in FIG. 1, a chuck table, denoted by 1, and an inspection apparatus, denoted by 10, according to the first embodiment jointly make up a processing apparatus, denoted by 100. The processing apparatus 100 illustrated in FIG. 1 is a cutting apparatus for cutting, i.e., processing, a workpiece, denoted by 200, of a frame unit, denoted by 210, illustrated in FIG. 2. The workpiece 200 to be processed by the processing apparatus 100 illustrated in FIG. 1 is a wafer such as a semiconductor device wafer or an optical device wafer shaped as a circular plate which is made of a base material such as silicon, sapphire, gallium, silicon carbide (SiC), lithium tantalate (LT), or lithium niobate (LN). The workpiece 200 includes a plurality of devices 203 formed in respective areas on a face side 201 thereof that are demarcated by a grid of projected dicing lines 202 on the face side 201.

According to the present invention, the workpiece 200 may be what is (generally) called a TAIKO (registered trademark) wafer having a thin central region and a thicker region on its outer circumferential portion, or a rectangular package substrate, ceramic substrate, ferrite substrate, a substrate containing at least one of nickel and iron, or the like having a plurality of resin-encapsulated devices thereon. According to the first embodiment, the workpiece 200 has a reverse side 204 stuck to a tape 205 having an outer circumferential edge portion on which an annular frame 206 is mounted, so that the workpiece 200 is supported on the annular frame 206. The workpiece 200, the tape 205, and the annular frame 206 jointly make up the frame unit 210 illustrated in FIG. 2. In other words, the frame unit 210 includes the workpiece 200 fixedly disposed in an opening 207 of the annular frame 206 by the tape 205.

The processing apparatus 100 illustrated in FIG. 1 is an apparatus for holding the workpiece 200 on a chuck table 1 and cutting, i.e., processing, the workpiece 200 with a cutting blade 121 along the projected dicing lines 202. As illustrated in FIG. 1, the processing apparatus 100 incorporates an inspection apparatus 10, and includes a pair of cutting units 120 each having a cutting blade 121 mounted on a spindle 122 for cutting the workpiece 200 held on the chuck table 1, a second camera unit 130, and a control unit 195.

According to the first embodiment, the inspection apparatus 10 is disposed in a main apparatus body 101 of the processing apparatus 100. As illustrated in FIGS. 1 and 3, the inspection apparatus 10 includes the chuck table 1 as a holding table, a camera unit 11 (only illustrated in FIG. 3), an X-axis moving unit 12 as a moving unit, and a rotating unit 13.

The chuck table 1 has a holding surface 2 for holding the frame unit 210 thereon. As illustrated in FIGS. 3, 4, and 5, the chuck table 1 includes a holder 3 made of a transparent material, an annular frame body 4 erected around and surrounding the holder 3, and a plurality of suction holes 5 defined in the frame body 4.

The holder 3 is made of glass or the like, i.e., quartz glass in the first embodiment, and is of a disk shape with the holding surface 2 as an upper surface for holding the workpiece 200 with the tape 205 interposed therebetween. The holding surface 2 is flat along both X-axis directions parallel to horizontal directions and Y-axis directions perpendicular to the X-axis directions and parallel to horizontal directions. The holding surface 2 of the holder 3 made of a transparent material lies flat in its entirety and is free of suction grooves for applying a vacuum therethrough to the workpiece 200 to hold the workpiece 200 under suction on the holder 3.

The frame body 4 is made of metal such as stainless steel. The frame body 4 is of a hollow cylindrical shape having an inside diameter equal to an outside diameter of the holder 3. The frame body 4 has an upper surface 6 disposed above the holding surface 2 and lying flat along both the X-axis directions and the Y-axis directions. The inside diameter of the frame body 4 is equal to or smaller than the inside diameter of the annular frame 206. According to the first embodiment, the inside diameter of the frame body 4 is smaller than the inside diameter of the annular frame 206. The inside diameter of the frame body 4 is larger than an outside diameter of the workpiece 200.

The suction holes 5 are open in an inner circumferential surface 7 of the frame body 4 between the holding surface 2 and the upper surface 6. According to the first embodiment, the suction holes 5 are circumferentially spaced apart along the frame body 4. As illustrated in FIG. 5, the suction holes 5 are connected through an on/off valve 8 to a suction source 9. The suction source 9 may be a vacuum pump, for example.

The chuck table 1 is movable along the X-axis directions by the X-axis moving unit 12 and rotatable about an axis parallel to Z-axis directions, which are perpendicular to the X-axis directions and the Y-axis directions, by the rotating unit 13. When the on/off valve 8 is opened, the chuck table 1 attracts and holds the workpiece 200 on the holding surface 2 with the tape 205 interposed therebetween under a vacuum produced by the suction source 9 and applied through the suction holes 5 between the tape 205 and the holding surface 2. According to the first embodiment, specifically, the chuck table 1 attracts and holds under suction the reverse side 204 of the workpiece 200 with the tape 205 interposed therebetween. While an opening 4-1 defined by the inner circumferential surface 7 of the frame body 4 is being covered by the tape 205 of the frame unit 210, a vacuum or suction force produced by the suction source 9 acts between the tape 205 and the holding surface 2, i.e., air is removed from between the tape 205 and the holding surface 2, bringing the tape 205 and the holding surface 2 into close contact with each other, and thereby securing the workpiece 200 of the frame unit 210 to the holding surface 2.

The camera unit 11 captures an image of the workpiece 200 held on the chuck table 1 through the holding surface 2 from the holding surface 2 side. According to the first embodiment, when the chuck table 1 is moved away from a cassette 171, to be described later, by the X-axis moving unit 12, the chuck table 1 moves over the camera unit 11, which is positioned below the holder 3 of the chuck table 1 and faces the workpiece 200 held on the holding surface 2 across the holder 3 and the tape 205 along the Z-axis directions.

The camera unit 11 includes an image capturing element for capturing an image of cut grooves not illustrated but cut by the cutting units 120 in the workpiece 200 held on the chuck table 1. The image capturing element may be a charge-coupled device (CCD) image sensor or a complementary metal-oxide-semiconductor (CMOS) image sensor, for example. The camera unit 11 captures an image of the cut grooves in the workpiece 200 and outputs the captured image to the control unit 195. Specifically, the camera unit 11 captures an image of the cut grooves in the workpiece 200 across the chuck table 1. The camera unit 11 is fixed to a Y-axis moving mechanism 21 which moves the camera unit 11 along the Y-axis directions.

The X-axis moving unit 12 relatively moves the chuck table 1 and the cutting units 120 in the X-axis directions parallel to the holding surface 2. According to the first embodiment, the X-axis moving unit 12 moves the chuck table 1 in the X-axis directions. The Y-axis moving mechanism 21 relatively moves the chuck table 1 and the camera unit 11 in the Y-axis directions parallel to the holding surface 2. As illustrated in FIG. 3, the X-axis moving unit 12 includes a known ball screw 14 rotatable about its own central axis, a known stepping motor 15 for rotating the ball screw 14 about its own central axis, and a known pair of guide rails 16 on which the chuck table 1 is movably supported for movement along the X-axis directions.

The rotating unit 13 rotates the chuck table 1 about its own central axis parallel to the Z-axis directions that are perpendicular to both the X-axis directions and the Y-axis directions. The rotating unit 13 rotates the chuck table 1 in an angular range exceeding 180 degrees but smaller than 360 degrees. The chuck table 1 and the rotating unit 13 are disposed on a casing 17 (see FIGS. 3 and 5) that is movable in the X-axis directions by the X-axis moving unit 12. The rotating unit 13 includes an electric motor 18 fixed to an outer side surface of the casing 17, a pulley 19 coupled to the output shaft of the electric motor 18, and a belt 20 trained around the chuck table 1 and movable about the central axis of chuck table 1 by the pulley 19. When the electric motor 18 is energized, the pulley 19 is rotated to cause the belt 20 to rotate the chuck table 1 about its central axis. According to the first embodiment, the rotating unit 13 is able to rotate the chuck table 1 through 220 degrees in both one direction about the central axis of chuck table 1 and the other direction that is opposite to the one direction.

As illustrated in FIG. 1, the processing apparatus 100 includes at least a Y-axis moving unit 140 for relatively moving the chuck table 1 and the cutting units 120 in the Y-axis directions and a pair of Z-axis moving units 150 for relatively moving the chuck table 1 and the cutting units 120 in the Z-axis directions. As illustrated in FIG. 1, the processing apparatus 100 is a two-spindle dicer, i.e., what is (generally) called a facing dual-type cutting apparatus, having the two cutting units 120.

Each of the cutting units 120 acts as a processing unit for processing the workpiece 200 held on the chuck table 1 with the cutting blade 121. The cutting unit 120 is movable with respect to the workpiece 200 held on the chuck table 1 in the Y-axis direction by the Y-axis moving unit 140 and in the Z-axis direction by the Z-axis moving unit 150.

As illustrated in FIG. 1, one of the cutting units 120 is supported on one post 104 of a portal-shaped annular support frame 103 erected on the apparatus body 101 through the Y-axis moving unit 140 and one of the Z-axis moving units 150. Similarly, the other cutting unit 120 is supported on another post 105 of the annular support frame 103 through the Y-axis moving unit 140 and the other Z-axis moving unit 150. The annular support frame 103 also includes a horizontal beam 106 interconnecting respective upper end portions of the posts 104 and 105.

The cutting units 120 are enabled by the Y-axis moving unit 140 and the Z-axis moving units 150 to position their cutting blades 121 at any desired positions over the holding surface 2 of the chuck table 1. Each of the cutting units 120 includes a spindle housing 123 movable in the Y-axis directions and the Z-axis directions respectively by the Y-axis moving unit 140 and the Z-axis moving unit 150, and a spindle 122 rotatably disposed in the spindle housing 123 and rotatable about its own central axis by an electric motor, not illustrated. The cutting blade 121 is mounted on a distal end portion of the spindle housing 123.

The second camera unit 130 is fixed to one of the cutting units 120 for movement in unison therewith. The second camera unit 130 includes an image capturing element for capturing an image of areas to be divided from the workpiece 200 held on the chuck table 1 before the workpiece 200 is cut. The image capturing element may be a CCD image sensor or a CMOS image sensor, for example. The second camera unit 130 captures an image of the workpiece 200 held on the chuck table 1 for use in an alignment process for positioning the workpiece 200 and the cutting blades 121 in alignment with each other, and outputs the captured image to the control unit 195.

The Y-axis moving unit 140 moves the cutting units 120 in the Y-axis directions as indexing-feed directions, thereby indexing-feeding the chuck table 1 and the cutting units 120 along the Y-axis directions relatively to each other. The Z-axis moving units 150 move the cutting units 120 in the Z-axis directions as cutting-feed directions, thereby cutting-feeding the chuck table 1 and the cutting units 120 along the Z-axis directions relatively to each other.

Each of the Y-axis moving unit 140 and the Z-axis moving units 150 includes respective known ball screws 141 and 151 rotatable about their own central axes, respective known stepping motors 142 and 152 for rotating the ball screws 141 and 151 about their own central axes, and respective known pairs of guide rails 143 and 153 on which the cutting units 120 are movably supported for movement in the Y-axis directions and the Z-axis directions.

The processing apparatus 100 further includes an X-axis direction position detecting unit, not illustrated, for detecting the position of the chuck table 1 in the X-axis directions, a Y-axis direction position detecting unit, not illustrated, for detecting the positions of the cutting units 120 in the Y-axis directions, and a Z-axis direction position detecting unit, not illustrated, for detecting the positions of the cutting units 120 in the Z-axis directions. Each of the X-axis direction position detecting unit and the Y-axis direction position detecting unit may include a linear scale parallel to the X-axis directions or the Y-axis directions and a reading head for reading graduations of the linear scale that is movable in the X-axis directions or the Y-axis directions by the X-axis moving unit 12 or the Y-axis moving unit 140. The X-axis direction position detecting unit and the Y-axis direction position detecting unit output information representing the graduations of the linear scale that have been read by the reading heads as information representing the position of the chuck table 1 in the X-axis directions or the positions of the cutting units 120 in the Y-axis directions to the control unit 195. The Z-axis direction position detecting unit detects the positions of the cutting units 120 in the Z-axis directions on the basis of the numbers of pulses of the stepping motors 152, and outputs information representing the detected positions of the cutting units 120 in the Z-axis directions to the control unit 195.

The processing apparatus 100 also includes a cassette elevator 170 for placing thereon a cassette 171 that houses a plurality of workpieces 200, which are to be cut and have been cut, at spaced intervals along the Z-axis directions and vertically moving the cassette 171 in the Z-axis direction, a cleaning unit 180 for cleaning workpieces 200 which have been cut, and a feed unit, not illustrated, for feeding frame units 210 between the cassette 171, the chuck table 1, and the cleaning unit 180. The feed unit feeds the annular frame 206 of the frame unit 210 to which a workpiece 200 to be cut is fixed to a position coaxial with the frame body 4.

The control unit 195 is a computer for controlling the units, described above, of the processing apparatus 100 and the inspection apparatus 10 to enable the processing apparatus 100 and the inspection apparatus 10 to perform a processing operation on a workpiece 200. The control unit 195 has an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the control unit 195 performs arithmetic processing operations according to computer programs stored in the storage apparatus and outputs control signals for controlling the processing apparatus 100 through the input/output interface apparatus to the units, referred to above, of the processing apparatus 100 and the inspection apparatus 10.

The control unit 195 is connected to a display unit, not illustrated, for displaying workpiece processing states and images captured by the camera units 11 and 130, and an input unit that is used by the operator to enter processing contents information. The display unit includes a liquid crystal display apparatus or the like. The input unit includes a touch panel on the display screen of the display unit or an external input apparatus such as a keyboard.

Figure 6:
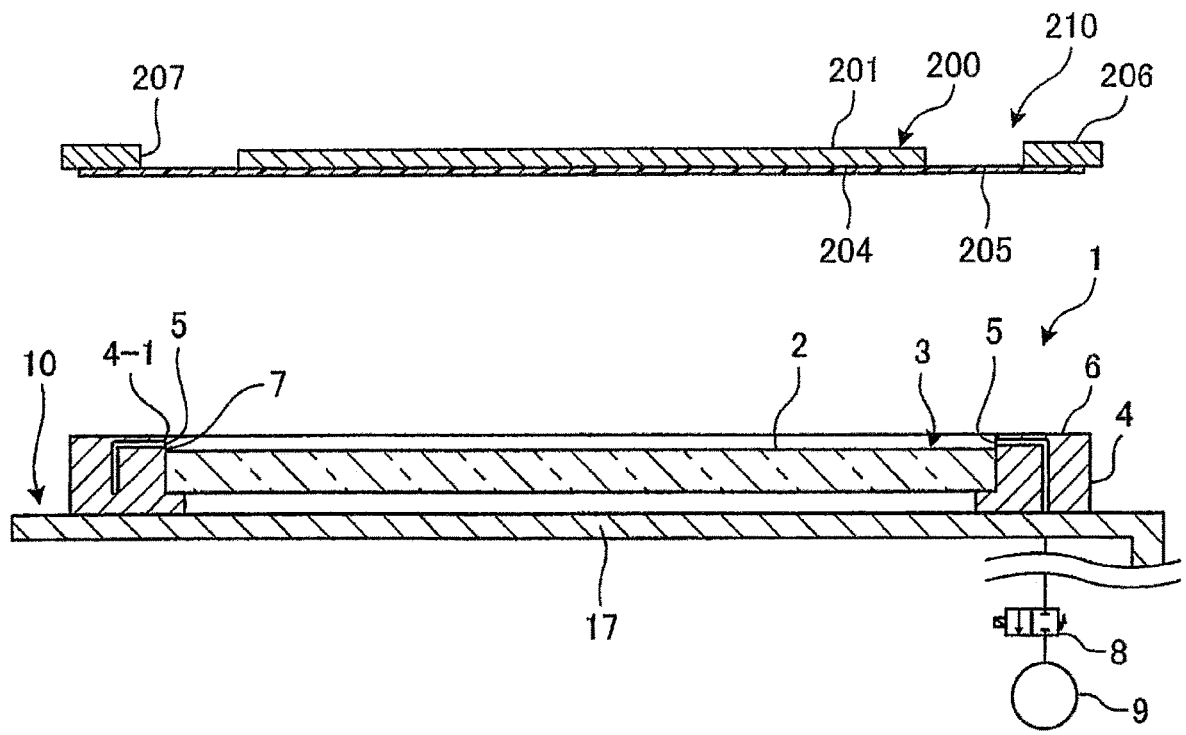
FIG. 6 is a cross-sectional view illustrating the manner in which a frame body of the chuck table of the processing apparatus illustrated in FIG. 1 and an annular frame of the frame unit are aligned with each other.
Figure 7:
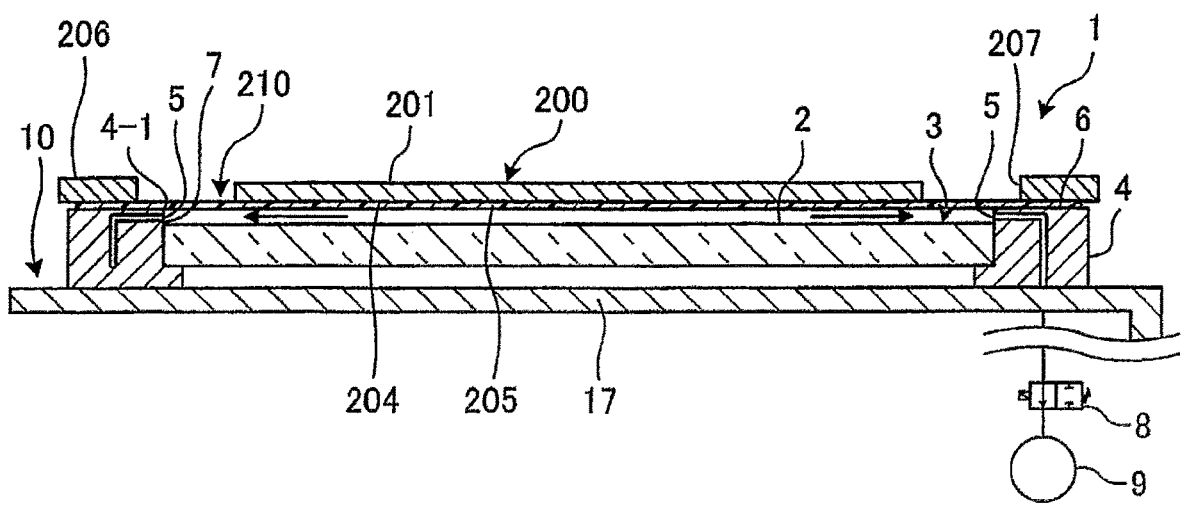
FIG. 7 is a cross-sectional view illustrating the manner in which the annular frame of the frame unit is placed on an upper surface of the frame body of the chuck table of the processing apparatus illustrated in FIG. 6.
Figure 8:
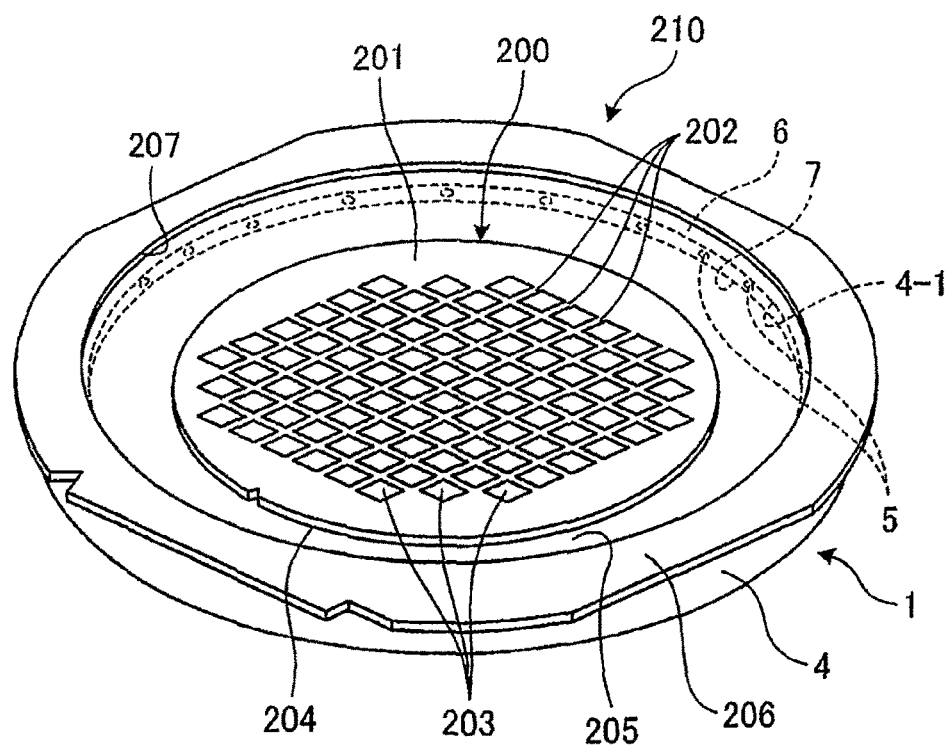
FIG. 8 is a perspective view illustrating the manner in which a workpiece is held under suction on a holding surface of the chuck table illustrated in FIG. 7 with a tape of the frame unit interposed therebetween.
Figure 9:
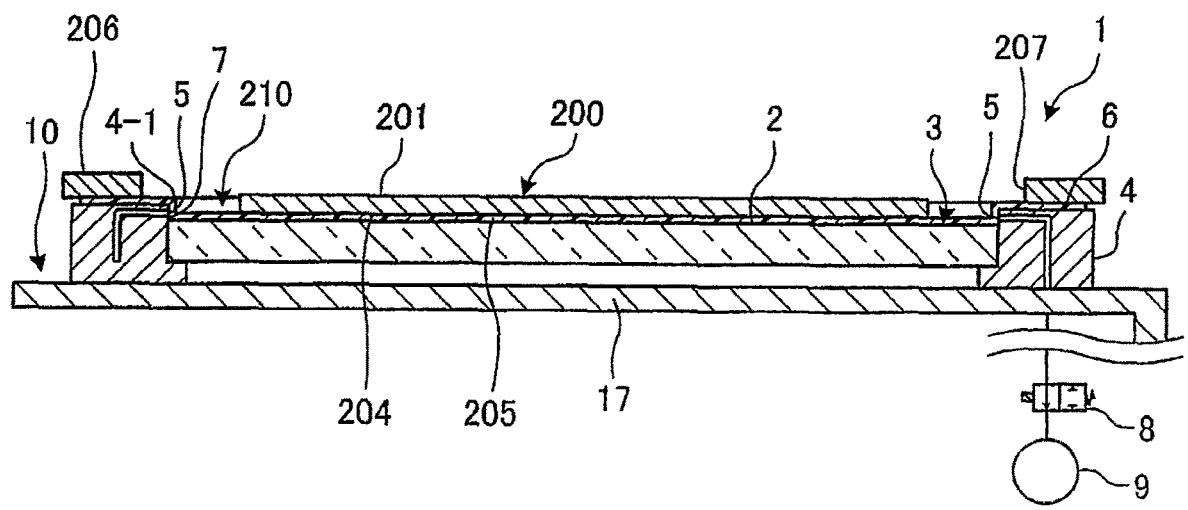
FIG. 9 is a cross-sectional view of the chuck table and the workpiece illustrated in FIG. 8.
Figure 10:
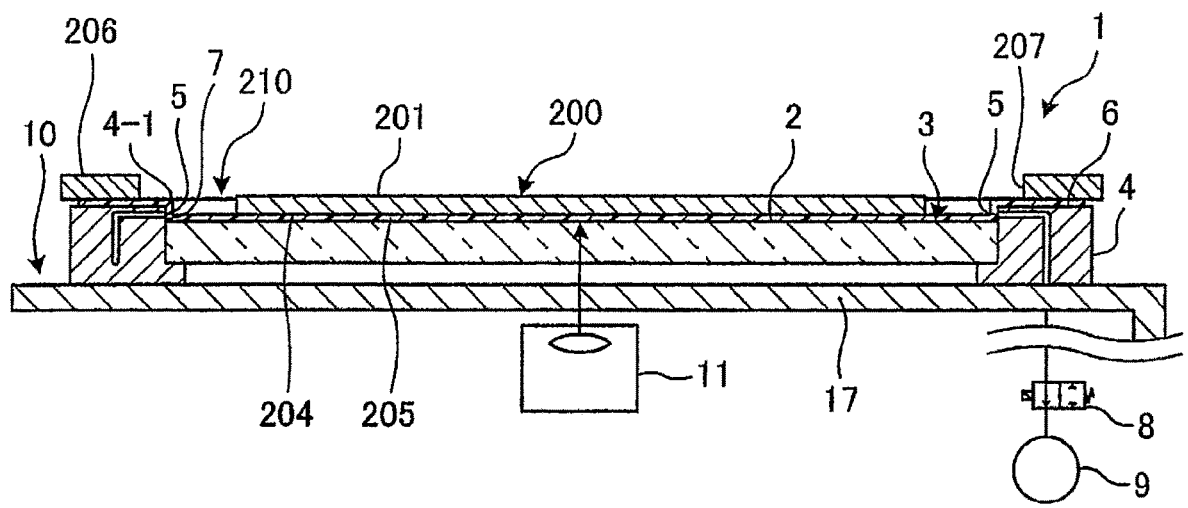
FIG. 10 is a cross-sectional view illustrating the manner in which a reverse side of the workpiece illustrated in FIG. 9 is observed with a camera unit.

A processing operation of the processing apparatus 100 of the above configuration will be described below. FIG. 6 illustrates in cross section the manner in which the frame body 4 of the chuck table 1 of the processing apparatus illustrated in FIG. 1 and the annular frame 206 of the frame unit 210 are aligned with each other. FIG. 7 illustrates in cross section the manner in which the annular frame 206 of the frame unit 210 is placed on an upper surface of the frame body 4 of the chuck table 1 of the processing apparatus illustrated in FIG. 6. FIG. 8 illustrates in perspective the manner in which a workpiece 200 is held under suction on the holding surface 2 of the chuck table 1 illustrated in FIG. 7 with the tape 205 of the frame unit 210 interposed therebetween. FIG. 9 illustrates in cross section the chuck table 1 and the workpiece 200 illustrated in FIG. 8. FIG. 10 illustrates in cross section the manner in which a reverse side of the workpiece 200 illustrated in FIG. 9 is observed with the camera unit 11.

In the processing operation, the operator registers processing contents information in the control unit 195, takes frame units 210 to which workpieces 200 to be cut are fixed into the cassette 171, and places the cassette 171 on an upper surface of the cassette elevator 170. Thereafter, in response to an instruction from the operator to start the processing operation, the processing apparatus 100 starts the processing operation.

When the processing apparatus 100 has started the processing operation, the control unit 195 controls the feed unit to deliver a workpiece 200 from within the cassette 171 to the chuck table 1 where the annular frame 206 of the frame unit 210 is positioned coaxially with the frame body 4 of the chuck table 1 as illustrated in FIG. 6, after which the annular frame 206 is placed on the upper surface 6 of the frame body 4 with the tape 205 interposed therebetween. At this time, the tape 205 is spaced from the holding surface 2 of the holder 3 and covers the entire surface of the holding surface 2 and the opening 4-1 surrounded by the inner circumferential surface 7 of the frame body 4.

As illustrated in FIG. 7, the control unit 195 opens the on/off valve 8 to transmit the vacuum or suction force from the suction source 9 to the suction holes 5, discharging air from between the holding surface 2 and the tape 205. Then, as illustrated in FIGS. 8 and 9, the tape 205 is brought into intimate contact with the holding surface 2, whereupon the reverse side 204 of the workpiece 200 is held under suction on the holding surface 2 with the tape 205 interposed therebetween. The control unit 195 controls the X-axis moving unit 12 to move the chuck table 1 to a position below the second camera unit 130, which captures an image of the workpiece 200 on the chuck table 1. The control unit 195 performs an alignment process based on the captured image, positioning the workpiece 200 and the cutting blades 121 in alignment with each other, and then controls the cutting blades 121 to cut into the workpiece 200 along the projected dicing lines 202 until the cutting blades 121 reach the tape 205 while relatively moving the chuck table 1 and the cutting blades 121 along the projected dicing lines 202. The cutting units 120 now cut the workpiece 200 on the chuck table 1 along the projected dicing lines 202, forming cut grooves, not illustrated, in the workpiece 200 along the projected dicing lines 202.

After the cutting blades 121 have formed the cut grooves along all or some of the projected dicing lines 202, the control unit 195 controls the X-axis moving unit 12 to move the chuck table 1 over the camera unit 11 of the inspection apparatus 10. The camera unit 11 then captures an image of the workpiece 200 cut by the cutting units 120 through the holder 3 of the chuck table 1, and the inspection apparatus 10 inspects the cut grooves on the basis of the captured image. Specifically, the camera unit 11 captures an image of the cut grooves formed in the reverse side 204 of the workpiece 200, and the inspection apparatus 10 inspects the cut grooves in the captured image to check whether or not the cut grooves are positionally acceptable and whether or not chips formed on the edges of the cut grooves are acceptable.

According to the first embodiment, the inspection apparatus 10 decides that the workpiece 200 is defective if the transverse centers of the cut grooves are spaced from the transverse centers of the corresponding projected dicing lines 202 by a predetermined distance or more, and decides that the workpiece 200 is acceptable if the transverse centers of the cut grooves are spaced from the transverse centers of the corresponding projected dicing lines 202 by less than the predetermined distance. According to the first embodiment, furthermore, the inspection apparatus 10 decides that the workpiece 200 is defective if the distance that a distal end of a chip is spaced from the corresponding edge of the cut groove is a predetermined distance or more, and decides that the workpiece 200 is acceptable if the distance is smaller than the predetermined distance. Alternatively, the inspection apparatus 10 may decide whether or not the workpiece 200 is acceptable by observing the cut groove in a predetermined position on the reverse side 204 of the workpiece 200, or by observing the cut grooves in the entire reverse side 204 of the workpiece 200. According to the first embodiment, as described above, the inspection apparatus 10 inspects the cut grooves in the captured image to check whether or not the cut grooves are positionally acceptable and whether or not chips formed on the edges of the cut grooves are acceptable. However, objects to be inspected by the inspection apparatus 10 and methods by which they are inspected by the inspection apparatus 10 are not limited to those illustrated in the first embodiment. According to the first embodiment, the second camera unit 130 also captures an image of the cut grooves in the face side 201 of the workpiece 200, and the captured image is used in deciding whether or not the cut grooves are acceptable.

After the workpiece 200 has been inspected, the control unit 195 releases the workpiece 200 from the chuck table 1, and controls the feed unit to move the frame unit 210 with the fixed workpiece 200 from the chuck table 1 to the cleaning unit 180. The control unit 195 then controls the cleaning unit 180 to clean the frame unit 210 with the fixed workpiece 200. Thereafter, the control unit 195 controls the feed unit again to move the frame unit 210 with the fixed workpiece 200 from the cleaning unit 180 to the cassette 171 where the workpiece 200 is stored again. The processing apparatus 100 finishes the processing operation when all the workpieces 200 from the cassette 171 have been processed and stored back in the cassette 171.

The chuck table 1 according to the first embodiment includes the frame body 4 surrounding the holder 3 made of a transparent material and having the upper surface 6 positioned upwardly from the holding surface 2 and also having the suction holes 5 that are open in the inner circumferential surface 7 of the frame body 4. While the opening 4-1 of the frame body 4 is being covered by the tape 205 of the frame unit 210, air between the holding surface 2 covered by the tape 205 and the tape 205 is discharged from the suction holes 5 to bring the tape 205 into intimate contact with the holding surface 2. As a result, the chuck table 1 is advantageous in that it makes it possible to bring the tape 205 smoothly into intimate contact with the holding surface 2 and leaves no air between the tape 205 and the holding surface 2, allowing the reverse side 204 of the workpiece 200 to be observed in its entirety. Therefore, the chuck table 1 is advantageous in that it makes it easy to observe the workpiece 200 placed on the holder 3 though the holder 3 is made of a transparent material.

Moreover, as the holding surface 2 of the holder 3 made of a transparent material is flat in its entirety and is free of suction grooves, the holding surface 2 prevents the camera unit 11 from failing to focus on and hence from observing the reverse side 204 of the workpiece 200.

The inspection apparatus 10 according to the first embodiment includes the chuck table 1 and the camera unit 11 for capturing an image of the workpiece 200 held on the chuck table 1 through the holding surface 2. The inspection apparatus 10 is advantageous in that even though the holder 3 of the chuck table 1 is made of a transparent material, the holding surface 2 is free of suction grooves and it is easy for the camera unit 11 to observe the workpiece 200 held on the holding surface 2.

Since the inspection apparatus 10 according to the first embodiment is incorporated in the processing apparatus 100 including the cutting units 120, it prevents the reverse side 204 of the workpiece 200 to be cut by the cutting units 120 from becoming difficult to be observed.

Second Embodiment

Figure 11:
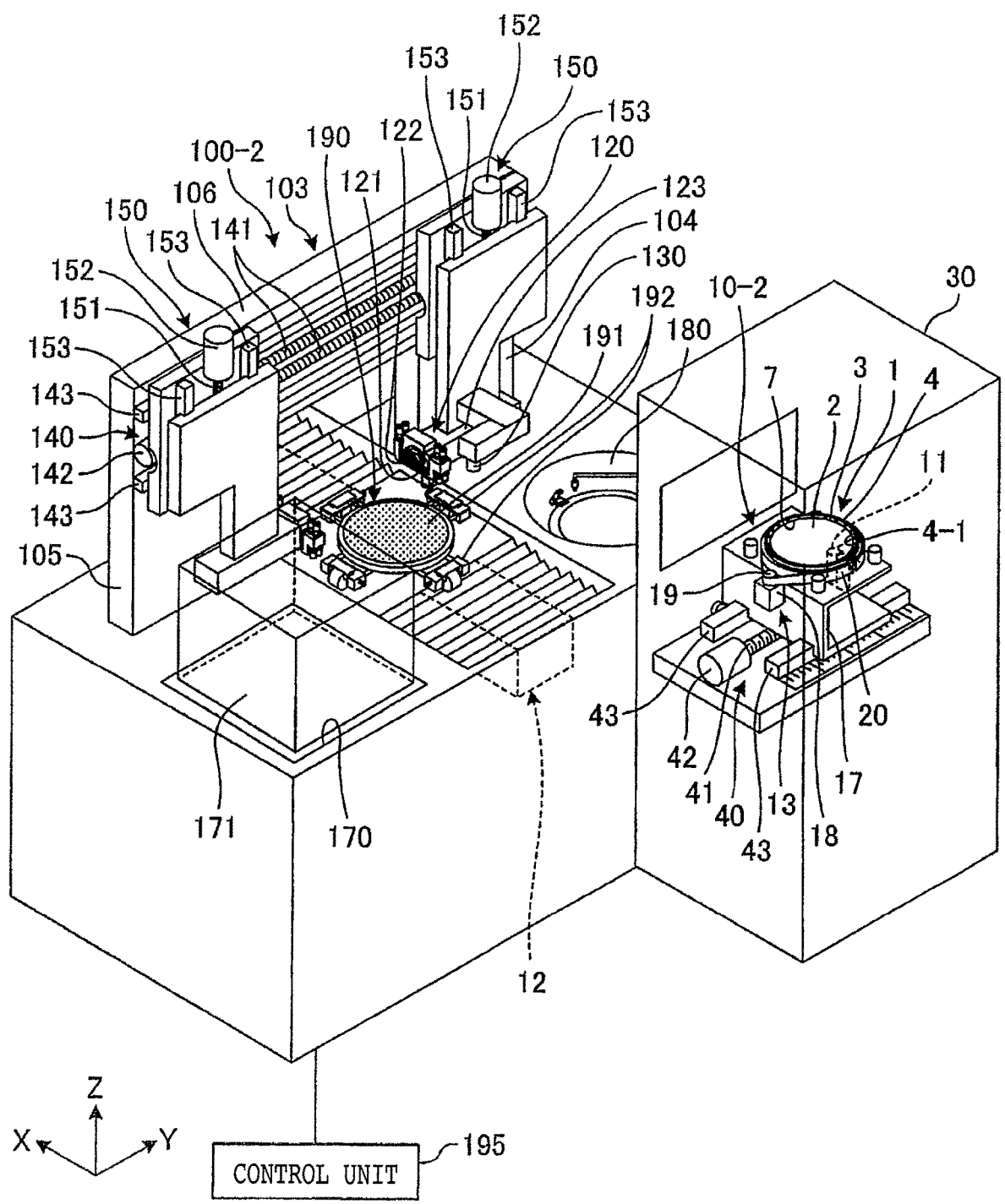
FIG. 11 is a perspective view illustrating by way of example a processing apparatus that incorporates an inspection apparatus including a chuck table according to a second embodiment of the present invention.

A chuck table and an inspection apparatus according to a second embodiment of the present invention will be described below with reference to the drawings. FIG. 11 illustrates in perspective by way of example a processing apparatus that incorporates an inspection apparatus including a chuck table according to the second embodiment. In FIG. 11, those parts which are identical to those according to the first embodiment are denoted by identical reference characters, and will not be described in detail below.

As illustrated in FIG. 11, an inspection apparatus, denoted by 10-2, according to the second embodiment is housed in an outer casing 30 attached to an outer side surface of a main apparatus body 101 of a processing apparatus, denoted by 100-2, and is incorporated in the processing apparatus 100-2. The processing apparatus 100-2 that incorporates the inspection apparatus 10-2 according to the second embodiment includes a chuck table 190 movable in the X-axis directions by the X-axis moving unit 12 and rotatable about an axis parallel to the Z-axis directions by a rotary actuator, not illustrated. The chuck table 190 is of a disk shape and has a holding surface 191 for holding a workpiece 200 thereon, the holding surface 191 being made of porous ceramics or the like. The chuck table 190 is different from the chuck table 1 of the inspection apparatus 10-1. The chuck table 190 is connected to a vacuum source, not illustrated. When the chuck table 190 is evacuated by the vacuum source, it attracts and holds the reverse side 204 of the workpiece 200 placed on the holding surface 191 under suction on the holding surface 191 with the tape 205 interposed therebetween. The chuck table 190 is surrounded by a plurality of clamps 192 for clamping the annular frame 206 in position to keep the workpiece 200 on the holding surface 191.

The inspection apparatus 10-2 according to the second embodiment is structurally similar to the inspection apparatus 10 according to the first embodiment except that it includes a moving unit 40 for relatively moving the chuck table 1 and the camera unit 11 in the Y-axis directions, instead of the X-axis moving unit 12. According to the second embodiment, the moving unit 40 moves the chuck table 1 in the Y-axis directions.

The moving unit 40 includes a known ball screw 41 rotatable about its own central axis, a known stepping motor 42 for rotating the ball screw 41 about its own central axis, and a known pair of guide rails 43 on which the chuck table 1 and the rotating unit 13 are movably supported for movement along the Y-axis directions.

In a processing operation, the processing apparatus 100-2 according to the second embodiment basically operates similarly to the processing apparatus 100 according to the first embodiment. The control unit 195 controls the feed unit to deliver a workpiece 200 from within the cassette 171 to the chuck table 1 where the workpiece 200 fixed to the frame unit 210 is placed on the holding surface 191 of the chuck table 190. The workpiece 200 is then held under suction on the holding surface 191 with the tape 205 interposed therebetween, and the annular frame 206 is clamped in position by the clamps 192. After the cutting blades 121 have formed cut grooves in the workpiece 200 along all the projected dicing lines 202 in the same manner as with the first embodiment, the workpiece 200 is released from the chuck table 190 and the annular frame 206 is released from the clamps 192.

The control unit 195 then controls the feed unit to move the frame unit 210 with the fixed workpiece 200 from the chuck table 190 to the cleaning unit 180. The control unit 195 then controls the cleaning unit 180 to clean the frame unit 210 with the fixed workpiece 200. Thereafter, the control unit 195 controls the feed unit again to move the frame unit 210 with the fixed workpiece 200 from the cleaning unit 180 to the inspection apparatus 10-2.

The inspection apparatus 10-2 basically operates similarly to the inspection apparatus 10 according to the first embodiment. The reverse side 204 of the workpiece 200 fixed to the annular frame 206 is held under suction on the holding surface 2 of the chuck table 1 with the tape 205 interposed therebetween. The control unit 195 controls the moving unit 40 to move the chuck table 1 to a position over the camera unit 11. The camera unit 11 then captures an image of the workpiece 200 cut by the cutting units 120 through the holder 3 of the chuck table 1, and the inspection apparatus 10-2 inspects the cut grooves on the basis of the captured image. After the workpiece 200 has been inspected, the workpiece 200 is released from the chuck table 1. The control unit 195 controls the feed unit to move the frame unit 210 with the fixed workpiece 200 from the chuck table 1 to the cassette 171. The processing apparatus 100 finishes the processing operation when all the workpieces 200 from the cassette 171 have been processed and stored back in the cassette 171.

The chuck table 1 according to the second embodiment includes the frame body 4 surrounding the holder 3 made of a transparent material and having the upper surface 6 positioned upwardly from the holding surface 2 and also having the suction holes 5 that are open in the inner circumferential surface 7 of the frame body 4, as with the chuck table 1 illustrated in FIG. 3. As a result, the chuck table 1 is advantageous in that it makes it possible to bring the tape 205 smoothly into intimate contact with the holding surface 2 and leaves no air between the tape 205 and the holding surface 2, allowing the reverse side 204 of the workpiece 200 to be observed in its entirety. Therefore, as with the first embodiment, the chuck table 1 and the inspection apparatus 10-2 are advantageous in that the chuck table 1 makes it easy to observe the workpiece 200 placed on the holder 3 though the holder 3 is made of a transparent material. The chuck table 1 according to the second embodiment may be used to decide by way of observation if the workpiece 200 is free of flaws or not and also if the devices 203 on the workpiece 200 are free of defects or not, before the workpiece 200 is processed.

(First Modification)

Figure 12:
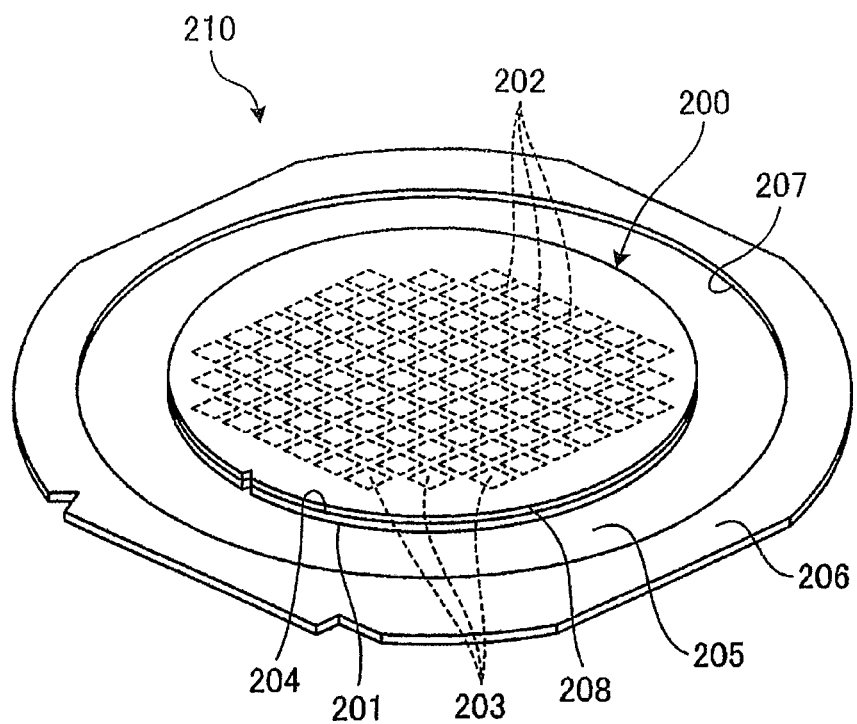
FIG. 12 is a perspective view of a frame unit including a workpiece to be processed by a processing apparatus including a chuck table and an inspection apparatus according to a first modification of the first and second embodiments.
Figure 13:
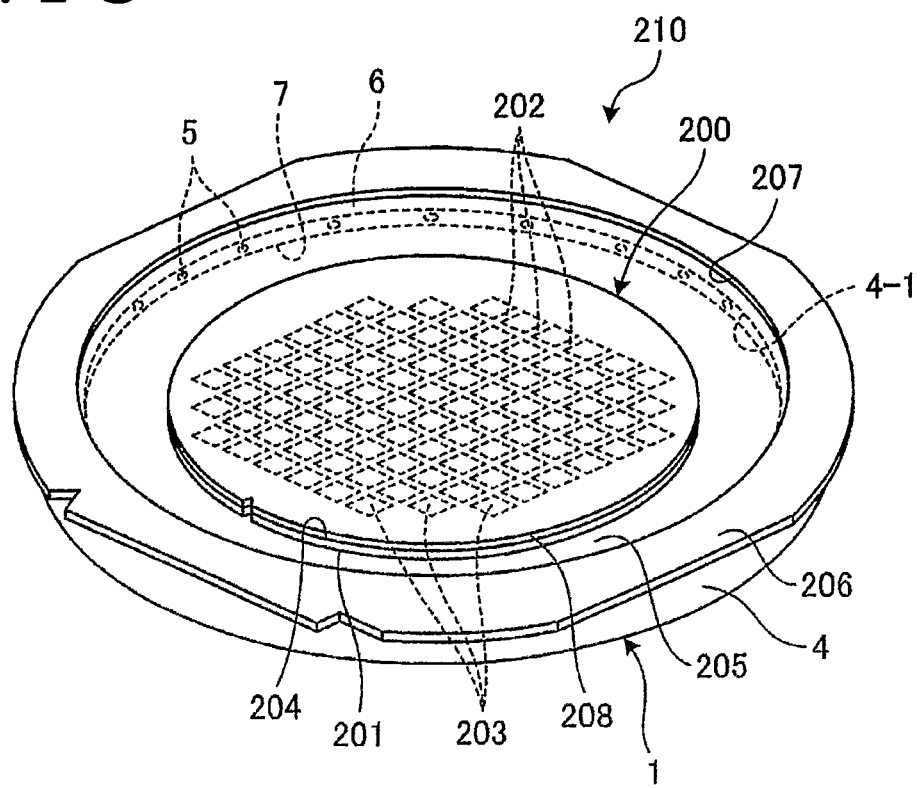
FIG. 13 is a perspective view illustrating the manner in which the frame unit illustrated in FIG. 12 is held under suction on the chuck table.

A chuck table and an inspection apparatus according to a first modification of the first and second embodiments of the present invention will be described below with reference to the drawings. FIG. 12 illustrates in perspective a frame unit including a workpiece to be processed by a processing apparatus including a chuck table and an inspection apparatus according to a first modification of the first and second embodiments. FIG. 13 illustrates in perspective the manner in which the frame unit illustrated in FIG. 12 is held under suction on the chuck table. In FIGS. 12 and 13, those parts which are identical to those according to the first and second embodiments are denoted by identical reference characters, and will not be described in detail below.

As illustrated in FIG. 12, a workpiece 200 to be processed by a processing apparatus, denoted by 100 or 100-2, including a chuck table, denoted by 1, and an inspection apparatus, denoted by 10 or 10-2, according to the first modification has a reverse side 204 with a metal film 208 disposed thereon over its entire surface and a face side 201 with devices 203 formed thereon. The face side 201 of the workpiece 200 is stuck to a tape 205, making up a frame unit 210.

The processing apparatus 100 or 100-2 including the chuck table 1 and the inspection apparatus 10 or 10-2 according to the first modification has a camera unit 11 that captures an image of the workpiece 200 on the chuck table 1 through the holding surface 2 of the holder 3 for an alignment process for positioning the workpiece 200 and the cutting blades 121 in alignment with each other. As with the first and second embodiments, the inspection apparatus 10 or 10-2 according to the first modification may inspect the workpiece 200 by capturing an image of the workpiece 200 through the holding surface 2 with the camera unit 11 after the workpiece 200 has been cut to form cut grooves therein.

The chuck table 1 according to the first modification includes a frame body 4 surrounding the holder 3 made of a transparent material and having an upper surface 6 positioned upwardly from the holding surface 2 and also having suction holes 5 that are open in the inner circumferential surface 7 of the frame body 4. As a result, the chuck table 1 is advantageous in that it makes it possible to bring the tape 205 smoothly into intimate contact with the holding surface 2 and leaves no air between the tape 205 and the holding surface 2, allowing the reverse side 204 of the workpiece 200 to be observed in its entirety. Therefore, in the same manner as with the first and second embodiments, the chuck table 1 and the inspection apparatus 10 or 10-2 are advantageous in that the chuck table 1 makes it easy to observe the workpiece 200 placed on the holder 3 though the holder 3 is made of a transparent material.

(Second Modification)

Figure 14:
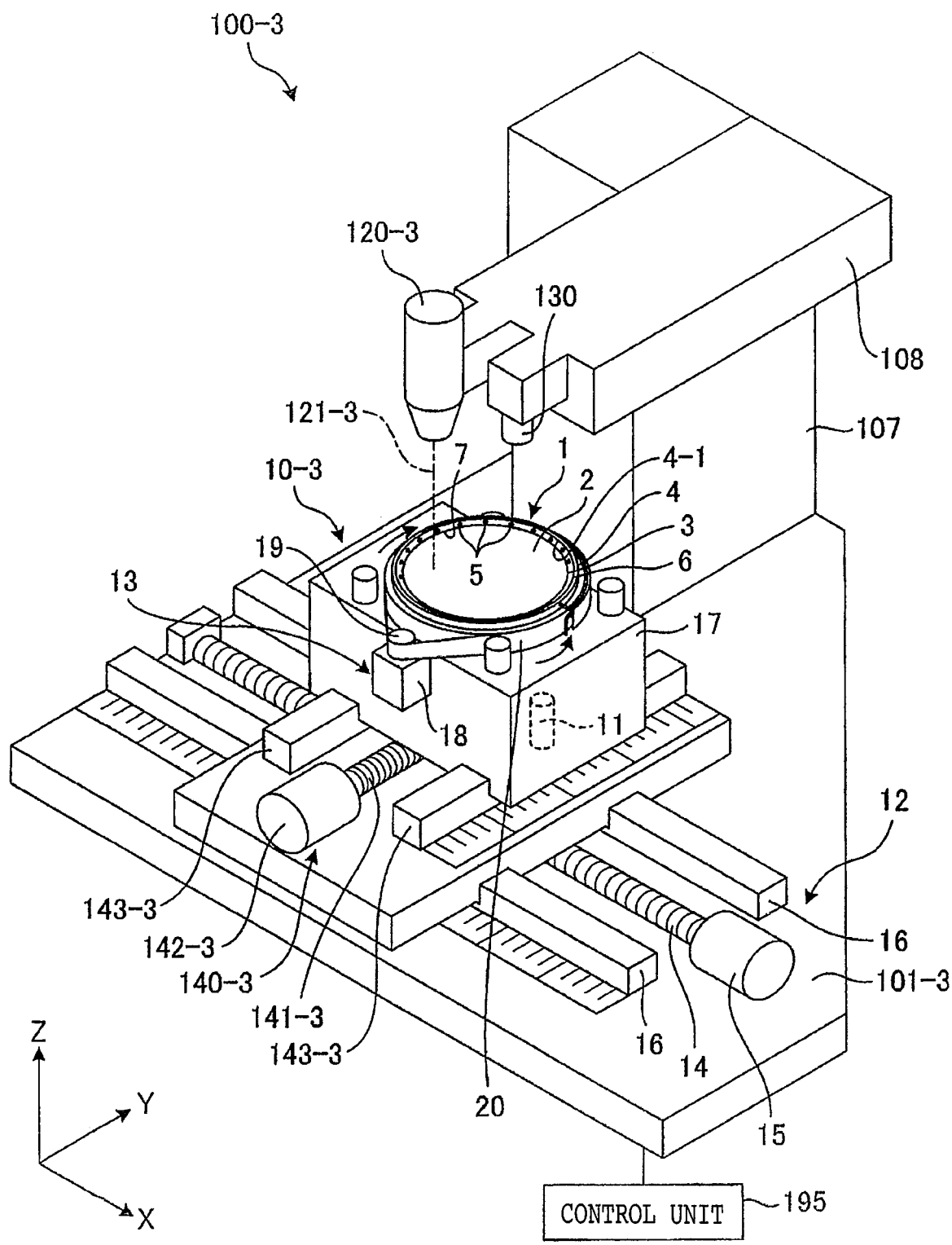
FIG. 14 is a perspective view illustrating by way of example a processing apparatus that incorporates an inspection apparatus according to a second modification of the first and second embodiments.

A chuck table and an inspection apparatus according to a second modification of the first and second embodiments of the present invention will be described below with reference to the drawings. FIG. 14 illustrates in perspective by way of example a processing apparatus that incorporates an inspection apparatus according to a second modification of the first and second embodiments. In FIG. 14, those parts which are identical to those according to the first and second embodiments are denoted by identical reference characters, and will not be described in detail below.

As illustrated in FIG. 14, a processing apparatus, denoted by 100-3, that incorporates a chuck table, denoted by 1, and an inspection apparatus, denoted by 10-3, according to the second modification is a laser processing apparatus including a laser beam applying unit 120-3 as a processing unit for processing the workpiece 200 with a laser beam 121-3. In the example illustrated in FIG. 14, the inspection apparatus 10-3 includes a Y-axis moving unit 140-3 as a moving unit. The Y-axis moving unit 140-3 relatively moves the chuck table 1, the inspection apparatus 10-3, and the camera unit 11 in the Y-axis directions. The Y-axis moving unit 140-3 includes a known ball screw 141-3 rotatable about its own central axis, a known stepping motor 142-3 for rotating the ball screw 141-3 about its own central axis, and a known pair of guide rails 143-3 on which the chuck table 1 and the rotating unit 13 that are disposed on the casing 17 are movably supported for movement along the Y-axis directions.

In the example illustrated in FIG. 14, furthermore, the inspection apparatus 10-3 is supported on a main apparatus body 101-3 by the X-axis moving unit 12 and the Y-axis moving unit 140-3. However, as with the second embodiment, the chuck table 190 may be mounted on the main apparatus body 101-3 by the X-axis moving unit 12 and the Y-axis moving unit 140-3, and the inspection apparatus 10-3 may be housed in an outer casing attached to an outer side surface of the main apparatus body 101-3 and may be incorporated in the processing apparatus 100-3. The processing apparatus 100-3 illustrated in FIG. 14 includes a laser beam applying unit 120-3 and a second camera unit 130 that are mounted on the distal end of a horizontal member 108 whose proximal end is supported on a post 107 erected from the main apparatus body 101-3.

The chuck table 1 according to the second modification includes a frame body 4 surrounding the holder 3 made of a transparent material and having an upper surface 6 positioned upwardly from the holding surface 2 and also having suction holes 5 that are open in the inner circumferential surface 7 of the frame body 4. As a result, the chuck table 1 is advantageous in that it makes it possible to bring the tape 205 smoothly into intimate contact with the holding surface 2 and leaves no air between the tape 205 and the holding surface 2, allowing the reverse side 204 of the workpiece 200 to be observed in its entirety. Therefore, in the same manner as with the first and second embodiments, the chuck table 1 and the inspection apparatus 10-3 are advantageous in that the chuck table 1 makes it easy to observe the workpiece 200 placed on the holder 3 though the holder 3 is made of a transparent material.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chuck table for holding a frame unit including a workpiece securely placed in an opening of an annular frame by a tape, comprising:
   a holder having a holding surface for holding the workpiece thereon with the tape interposed therebetween, the holder being made of a transparent material; and
   a frame body erected around the holder and surrounding the holder, the frame body having an upper surface stepped above the holding surface, a lower surface opposite the upper surface, an inner circumferential surface between the upper surface and the lower surface, and a plurality of suction holes defined in the frame body and open in the inner circumferential surface of the frame body between the holding surface and the upper surface, wherein the frame body has an inside diameter equal to or smaller than an inside diameter of the annular frame, and,
   while an opening of the frame body is being covered by the tape of the frame unit, a suction force is transmitted through the suction holes into the frame body, discharging air from between the tape and the holding surface to bring the tape into intimate contact with the holding surface thereby securing the workpiece of the frame unit to the holding surface.

2. The chuck table according to claim 1,
   wherein the holding surface of the holder is flat in its entirety and is free of suction grooves.

3. An inspection apparatus for inspecting a workpiece, comprising:
   a chuck table for holding, on a holding surface, a frame unit including a workpiece securely placed in an opening of an annular frame by a tape;
   a camera unit for capturing an image of the workpiece held on the chuck table through the holding surface from a holding surface side; and
   a moving unit for relatively moving the chuck table and the camera unit in X-axis directions parallel to the holding surface or Y-axis directions perpendicular to the X-axis directions,
   wherein the chuck table includes:
      a holder having the holding surface for holding the workpiece with the tape interposed therebetween, the holder being made of a transparent material, and
      a frame body erected around the holder and surrounding the holder, the frame body having an upper surface stepped above the holding surface, a lower surface opposite the upper surface, an inner circumferential surface between the upper surface and the lower surface, and a plurality of suction holes defined in the frame body and open in the inner circumferential surface of the frame body between the holding surface and the upper surface,
   wherein the frame body has an inside diameter equal to or smaller than an inside diameter of the annular frame, and, while an opening of the frame body is being covered by the tape of the frame unit, a suction force is transmitted through the suction holes into the frame body, discharging air from between the tape and the holding surface to bring the tape into intimate contact with the holding surface thereby securing the workpiece of the frame unit to the holding surface.

4. The inspection apparatus according to claim 3, wherein the inspection apparatus is incorporated in a processing apparatus including a processing unit for processing the workpiece with a cutting blade or a laser beam, and the processing unit processes the workpiece held on the chuck table and inspects the workpiece by capturing an image of the workpiece processed by the processing unit through the chuck table.

5. The inspection apparatus according to claim 3, wherein the work piece is held on the holder with a face side of the work piece against with the holding surface.

6. The inspection apparatus according to claim 3, wherein the work piece is held on the holder with a reverse side of the work piece against the holding surface.

\* \* \* \* \*